United States Patent [19]

Ushida et al.

[11] Patent Number: 5,276,012
[45] Date of Patent: Jan. 4, 1994

[54] LASER-ASSISTED CVD PROCESS FORMING OXIDE SUPERCONDUCTING FILMS

[75] Inventors: Takahisa Ushida; Kazutoshi Higashiyama; Izumi Hirabayashi; Shoji Tanaka, all of Aichi, Japan

[73] Assignees: NGK Spark Plug Co., Ltd., Aichi; International Superconductivity Technology Center; Hitachi Ltd., both of Tokyo, all of Japan

[21] Appl. No.: 833,509

[22] Filed: Feb. 11, 1992

[30] Foreign Application Priority Data

Feb. 12, 1991 [JP]  Japan ................................. 3-41326

[51] Int. Cl.$^5$ ........................ B05D 3/06; C23C 16/00
[52] U.S. Cl. ......................... 505/1; 505/734; 505/730; 427/62; 427/596; 427/255.3; 427/255.2; 427/255.1; 427/126.3; 427/314
[58] Field of Search .................... 505/1, 734, 730; 427/62, 63, 255.3, 596, 126.3, 255.2, 255.1, 314

[56] References Cited

PUBLICATIONS

Ushida et al, "Preparation of a-axis oriented $Y_1Ba_2Cu_3O_{7-\delta}$ films by laser metalorganic chemical vapor deposition", Appl. Phys. lett. 59(7) Aug. 1991 pp. 860–862.
Ushida et al, "Excimer laser-assisted chemical vapor deposition of metal-oxide thin film from B-diketonate complexes", Jpn. J. Appl. Phys. 30(1A) Jan. 1991 L35-L38.
Yamane et al, "Formation of Bismuth Strontium Calcium copper oxide superconducting films by chemical vapor deposition", Jpn. J. Appl. Phys. 27(8) Aug. 1988 pp. L1495-L1497.
Supercond. Sci. Technol. 4 (1991), pp. 445–448, T. Ushida et al, "Preparation of selectively controlled a-axis oriented YBCO films by laser MOCVD.".

Primary Examiner—Roy King
Attorney, Agent, or Firm—Sughrue, Mion, Zinn Macpeak & Seas

[57] ABSTRACT

A method is disclosed of forming an oxide superconducting film comprising the steps of (1) mixing (a) the vapors of organic metal materials in such proportions as to provide a predetermined metal composition, or (b) said organic metal materials in such proportions as to provide a predetermined metal composition vaporizing and mixture, and (2) bringing the mixture into contact with a heated substrate so that an oxide superconducting film is formed on said substrate by a chemical vapor deposition process, wherein laser light is applied onto said substrate during formation of said oxide superconducting film on said substrate, whereby the crystallographic orientation of said oxide superconducting film being formed in the irradiated area of said substrate is such that the c-axis is parallel to the substrate.

11 Claims, 10 Drawing Sheets

1 μm

LASER-ASSISTED CVD PROCESS FORMING OXIDE SUPERCONDUCTING FILMS

BACKGROUND OF THE INVENTION

This invention relates to a method of forming oxide superconducting films of Y-Ba-Cu-O (Y is at least one element selected from among Y and Ln (lanthanoids); and other systems while enabling the film to be suitably oriented (e.g., the c-axis is parallel to the substrate). The invention also relates to oxide superconducting members having the oxide superconducting films formed by that method. The concept of this invention is applicable to the fabrication of devices such as Josephson junctions.

A method has been known that produces an oxide superconductor by applying a laser beam onto a film formed by coating a solution containing organic metal salts (see Unexamined Published Japanese Patent Application No. 255506/1990). In this method, ultraviolet rays are applied as an auxiliary source of exciting light. A method is also known whereby a thin film is formed containing a Y-Ba-Cu-O system, with the c-axis being parallel to a substrate such as MgO. This method utilizes sputtering in an $O_2$-Ar atmosphere under vacuum (see Science, Vol. 249, 28 Sep. 1990 Reports, 1549–1552; Appl. Phys. Lett, 57(23), 3 Dec. 1990 p. 2484–2486; and Physica C 170(1990), 325–332, North Holland).

Many versions of the MOCVD process (organic metal chemical vapor deposition process) have been known as techniques for forming oxide films or oxide superconducting films by application of ultraviolet or laser light. See, for example, Proceedings of the 37th Symposium of the Japan Society of Applied Physics, spring 1990, p. 136, 27a-PB-7, 27a-PB-9 and page 138, 27a-PB-15; Proceedings of the 2nd International Symposium on Superconductivity (ISS '89), Tsukuba, 1989, p. 767; Unexamined Published Japanese Patent Application Nos. 230522/1988, 224117/1988, 225599/1988 and 224116/1988.

However, the prior known method proposed in Unexamined Published Japanese Patent Application No. 255506/1990 does not rely upon CVD and, as shown in FIG. 14, the c-axis of the oxide film formed by this method is not oriented in a constant direction as being parallel to the substrate but the ab-plane is parallel to the temperature gradient.

The second method which forms a superconducting film having the crystal growth direction oriented along the a-axis also does not rely upon CVD and, furthermore, the desired thin film oriented along the a-axis cannot be readily formed at a desired location in the matrix.

In addition, the many versions of the MOCVD process are not such that an oxide superconducting film oriented along the a-axis can be formed in a desired location.

SUMMARY OF THE INVENTION

The present invention has accomplished an object, a method by which an oxide superconducting film, controlled in a constant direction (e.g. the c-axis is oriented parallel to the substrate) can be readily formed in a desired location. This object is accomplished by applying ultraviolet radiation, in particular, laser light in the ultraviolet region.

According to the present invention, there is to provide a method for forming an oxide superconducting film comprising the steps of (1)(a) mixing the vapors of organic metal source materials (source gas) in such proportions as to provide a predetermined metal composition or (b) mixing said organic metal materials in such proportions as to provide a predetermined metal composition and then vaporizing the source material, and (2) bringing a source gas into contact with a heated substrate so that an oxide super conducting film is formed on said substrate by a chemical vapor deposition process, wherein laser light is applied onto said substrate during the formation of said oxide superconducting film on said substrate, whereby the crystallographic orientation of said oxide superconducting film being formed in the irradiated area of said substrate is held in a constant direction, and an oxide superconducting member formed.

DETAILED DESCRIPTION OF THE INVENTION

Figure 1:
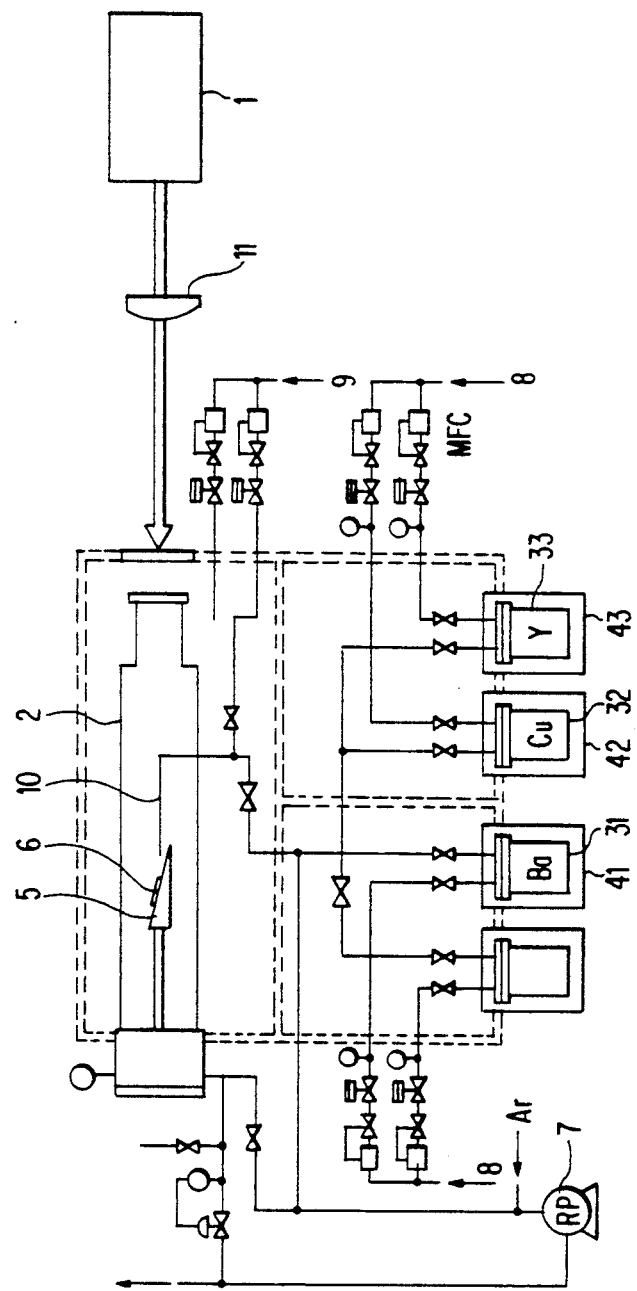
FIG. 1 is a schematic diagram of the apparatus used in the Example of the present invention for forming oxide superconducting films.

In accordance with a first embodiment of the present invention, there is .provided a method of forming an oxide superconducting film comprising the steps of mixing the vapors of organic metal materials (source gas) in such proportions as to provide a predetermined metal composition or mixing said organic metal materials in such proportions as to provide a predetermined metal composition, vaporizing the source material, and then bringing the source gas into contact with a heated substrate so that an oxide superconducting film is formed on said substrate by a chemical vapor deposition (CVD) process such as MOCVD, Halide CVD and the like. This method is characterized in that during the formation of said oxide superconducting film on said substrate, laser light is applied onto said substrate, whereby the crystallographic orientation of the oxide superconducting film being formed in the irradiated area of the substrate is held in a constant direction.

The organic metal materials may be organic metal complexes or any other organic metal compounds. The metal species, their proportions in the final metal composition, and the kind of the associated organic moiety may be selected according to the kind of the oxide superconducting film to be formed.

Examples of the organic metal materials include β-diketone complex compounds represented by formula:

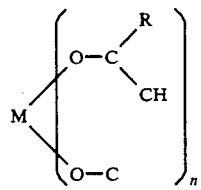

wherein M represents metal selected from Y, Ba, Cu, and etc; R and R' may be the same or different, and represent $CH_3$, $CF_3$, $C(CH_3)_3$, $CF_2CF_3$, $(CF_2)_2CF_3$, thiophene, or furan; and n represents an integer of 2 or 3, in which when "M" takes Y, n is 3 and when M takes Ba and Cu, n is 2. The examples of the organic moiety in the formula above include acetylacetonate (ACAC), dipivaloylmethanate (DPM), trifluoroacetylacetonate (TFA), hexafluoroacetylacetonate (HFA), trifluoroacetylpivaloylmethanate (TPM), pentafuluoropropanoylpivaloylmethanate (PPM), pentafluorobutanoylpivaloylmethanate (HPM), thenoyltrifluoroacetonate (TTA), furoyltrifluoroacetonate (FTA) and the like.

The substrate may be heated to any temperature that is higher than the point at which the organic metal materials used are decomposed (usually, the substrate is heated to 400° C. and above).

The oxide superconducting film is formed in accordance with the kinds of selected organic metal materials and their mixing proportions. Further, the direction of its crystallographic orientation is not limited as long as it is constant. If desired, the film may be made of a Y-Ba-Cu-O oxide, with the direction of its crystallographic orientation being such that the c-axis is parallel to the substrate. The proportions of Y, Ba, Cu and O may be selected in various ways so that the resulting film will exhibit superconductivity.

The oxide superconducting film may be made of a Bi-Sr-Ca-Cu-O oxide, a Tl-Ba-Ca-Cu-O oxide or a Tl-Sr-Ca-Cu-O oxide. If desired, part of Bi may be replaced by another metal element such as Pb, or part of Ba may be replaced by another metal element such as Sr, or certain of the metal elements specified above may be otherwise replaced by other metal elements.

The method for bringing the mixture of vaporized organic metal materials into contact with the substrate is not limited in any particular way; it may be sprayed onto the substrate or permitted to flow gently in such a way that the metal particles will drift over the substrate; if desired, the mixture need not be supplied continuously and, instead,..the supply of gas or gases may be alternated by deposition under vacuum. Any carrier gas used in CVD process may be used, and an innert gas, such as AR, He, $N_2$ can be used.

The laser light is preferably an ultraviolet radiation emitting at one or more wavelengths in the range of 150 to 400 nm. This is in order to ensure that the organic metal materials are effectively excited, and that only the desired area of the deposited film is positively oriented in a constant direction. The laser light to be applied need not emit in the ultraviolet region. It may be light in other wavelength ranges such as in the infrared region.

The laser light may be applied onto the substrate to form disperse spots, parallel lines, a grid pattern or various other geometries, so that a predetermined pattern of the irradiated area is produced in the matrix.

In accordance with the second embodiment of the present invention, there is provided an oxide superconducting member the comprises a substrate and an oxide superconducting film formed on said substrate, said oxide superconducting film is composed of a Y(Ln)-Ba-Cu-O oxide where Y(Ln) is at least one element selected from among Y and Ln (lanthanoids), the direction of its crystallographic orientation being such that the c-axis is parallel to the substrate, and its surface being smooth to such an extent that no asperities are observable in an electron micrograph taken at a magnification of 14,000.

The irradiated area of the oxide superconducting film, where its crystallographic orientation has a constant direction, can be formed in such a way as to create disperse spots, parallel lines, a grid pattern or some other specified geometry in the matrix (oxide superconducting film) where the c-axis is not parallel to the substrate.

The substrate may be of any type that permits the growth of a desired oxide superconducting film and it is typically made of a ceramic material (including a non-oxidized substance such as Si). However, a ceramic material is not the only type which may be used in the present invention. Other substrate materials such as metals and glass may be used. If desired, the substrate may have a layer of ceramic or other suitable materials formed on the surface of a support.

Examples of the substrate material include MgO(100), Mg(010), Mgo(001), polycrystalline MgO, $SrTiO_3(100)$, $SrTiO_3(010)$, $SrTiO_3(001)$, YSZ(100), polycrystalline SrTiO₃, polycrystalline YSZ, LaAlO₃, LaGaO₃, Al₂O₃, SiO₂, NdGaO₃, ZrO₂, Si, and various metals and compounds used as a substrate for epitaxial growth.

At least the surface of the substrate of the presently claimed invention, first and second embodiment may be formed of a ceramic material preferably such as MgO, SrTiO₃, LaAlO₃, LaGaO₃, Al₂O₃, Si, SiO₂, NdGaO₃ or yttria-stabilized zirconia.

Further, in the first and second embodiments of the presently claimed invention, the oxide superconducting film may be formed on the faces of MgO crystal, the faces of SrTiO₃ crystal except (100) face, the faces of LaAlO₃ crystal except (100) face or the faces of yttria-stabilized zirconia (YSZ) crystal, said faces being formed on at least the surface of the substrate. The known oxide superconducting films that can be formed on those faces are generally limited to such that the c-axis is normal to the substrate because it has been difficult to form films in which the c-axis is parallel to the substrate.

The thickness of the oxide superconducting film may be of such an order that it can be attained by the CVD process. The film may be a "thin film" or a "thick film", with its thickness usually ranging from about 10 Å to less than 1000 μm (e.g. ca. 500 μm).

The operating principle of the presently claimed method is believed to be as follows When vaporized molecular organic metal materials are irradiated with laser light, especially in the ultraviolet range, those materials are excited. If the molecules of those organic metal materials are adsorbed on the substrate or if they form clusters on the substrate, they are further activated upon exposure to the ultraviolet radiation. At the same time, those materials will form an oxide of a predetermined metal composition on the heated substrate and it will grow in a vapor phase, with its crystallographic orientation being controlled in a constant direction (e.g. the c-axis is parallel to the substrate).

Examples of the laser light according to the present invention include ArF excimer lazer, KrF excimer lazer and etc.

Figure 14:
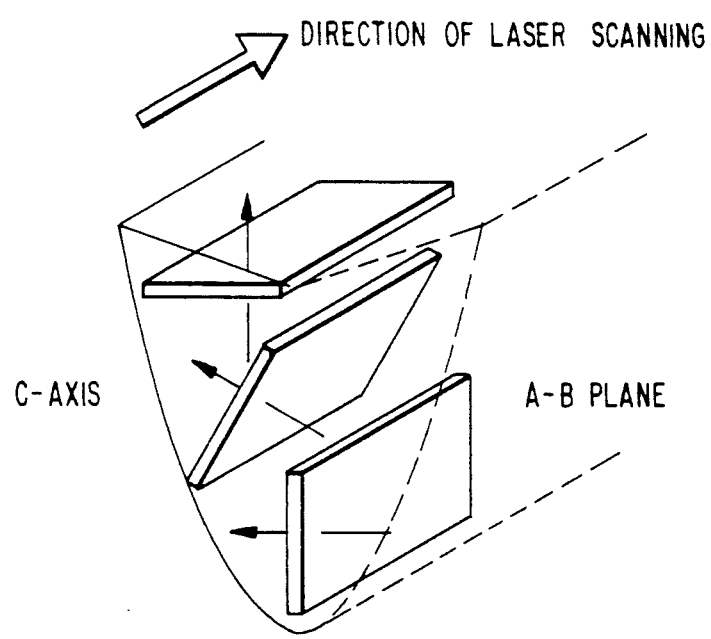
FIG. 14 is a diagram illustrating the crystallographic orientation and concave or recessed surface of the oxide superconducting film formed by another technique.

If the laser light emitted is used as a heat ray so that a coated film of a predetermined composition is decomposed both thermally and oxidatively to form a superconducting film, its crystallographic orientation will not be in a constant direction and the surface is recessed or concave as illustrated in FIG. 14. Further, in the conventional MOCVD process, ultraviolet radiation is not used. Even if it were used, it is only effective as an auxiliary means of generating ozone, and no mention has been made of the crystal structure, especially, orientation of the film.

Figure 8:
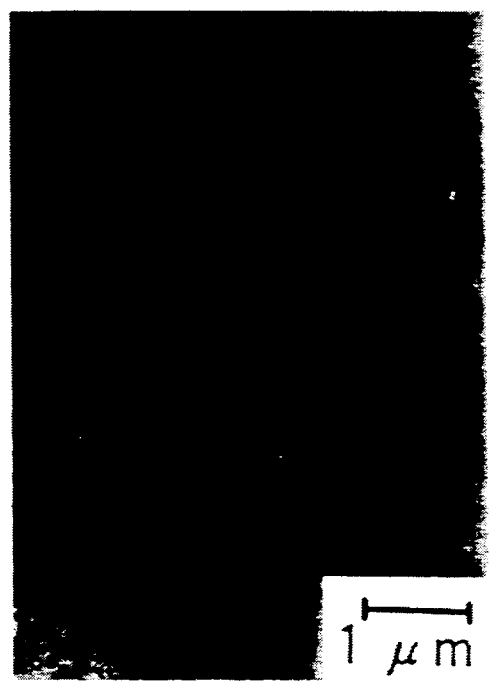
FIG. 8 is a micrograph ($\times$14000) showing the crystal structure of the surface of the oxide superconducting film formed in the UV-irradiated area of the substrate in Example 1, Test 2 in which a scale shows in 1 $\mu m$.
Figure 9:
FIG. 9 is a micrograph ($\times$10000) showing the crystal structure of the surface of the oxide super-conducting film formed in the non-irradiated area of the substrate in Example 1, Test 2 with the same scale as of FIG. 8.

However, in accordance with the present invention, the direction of crystallographic orientation in the film is held constant and its surface is very smooth (as is evident from the comparison between FIG. 8, which is a micrograph (×14000) of the UV-irradiated surface, and FIG. 9 which is a micrograph of the non-irradiated surface). The present invention was achieved on the basis of those findings.

The method of the present invention for forming oxide superconducting films has the following advantages. First, oxide superconducting films, which are held in a constant direction of crystallographic orientation (e.g. the c-axis is oriented parallel to the substrate) and which have critical temperatures that are comparable to or higher than the heretofore achieved values can be formed easily and in a desired position.

Second, the use of laser light ensures that oxide superconducting films, which are held to have a constant direction of crystallographic orientation (e.g., the c-axis is oriented parallel to the substrate as mentioned above) in a given matrix, can be formed in a desired position by the simple method of applying laser light.

Therefore, oxide superconducting members having oxide superconducting films of such a structure that an irradiated area having the crystallographic orientation controlled in a constant direction is formed as disperse spots, parallel lines, in a grid, or some other predetermined pattern in a given matrix, have the "pinning effect" and will, therefore, exhibit practical performance by virtue of the high critical current density $J_c$.

In addition, the oxide superconducting films, which are formed by the method of the present invention and which may be used as part of oxide superconducting members, have very smooth surfaces and, if the c-axis is oriented parallel to the substrate, the length of coherence is sufficiently increased to provide ease in the fabrication of devices such as Josephson junctions.

The following example is provided for the purpose of further illustrating the present invention but is in no way to be taken as limiting.

EXAMPLE 1

(1) Test apparatus

The apparatus used in the example is shown schematically in FIG. 1. It had a reaction tube 2 that contained a heater 5 located in a predetermined position for heating a substrate 6 that could be placed on top of the heater 5 at a suitable..angle with the central axis of the reaction tube 2. A UV generator 1 (an excimer laser manufactured by LAMBDA PHYSIK A.G.) was provided in such a way as to emit an ultraviolet radiation that would transmit a quartz window in the reaction tube 2 to irradiate the substrate 5. The emitted ultraviolet light was be focused by a convex lens 11 to provide radiation along the central axis of the reaction tube 2.

Organic metal complex materials were placed within associated tubes 31, 32 and 33 and evaporated by heating with respective heaters 41, 42 and 43. Those materials were diluted by a carrier gas (Ar) supplied through an inlet 8, whereby the vaporized gases of those materials were mixed in predetermined proportions. As for the carrier gas, any innert gas such as He, N₂ and etc. can be used. Oxygen was also introduced in a predetermined almost through an inlet 9 provided at a position halfway the length of the reaction tube 2. A gaseous mixture of the respective materials mentioned above was forced onto the front portion of the substrate 6 in the reaction tube 2. The interior of the reaction tube 2 was evacuated by means of a rotary pump 7.

(2) Formation of oxide superconducting film

Oxide superconducting films were formed under the following conditions. The starting materials were diketone complexes of Y(DPM)₃, Ba(DPM)₂ and CU(DPM)₂, where DPM is the abbreviation for dipivaloyl methane. These starting materials were heated at respective temperatures of 123° C., 233° C. and 116° C., with the carrier gas (Ar) being supplied at flow rates of 12.0 cc/min/, 12.0 cc/min. and 19.0 cc/min. for the respective materials. Oxygen was supplied at a flow rate of 80 ccm and the pressure in the reaction tube 2 was held at 3 Torr during film formation. To generate an ultraviolet radiation, an ArF laser having an operating wavelength of 193 nm was oscillated at 20 Hz for a power output of 100 mJ/cm$^2$. The film formation was continued for 1 h.

The substrate was made of MgO having a (100) face at the surface and it was heated at 700° C., 650° C. and 600° C.

(3) Test results

The substrate was partly irradiated (scanned) with the ArF laser under the following conditions to form oxide superconducting films.

(i) Test 1

Figure 2:
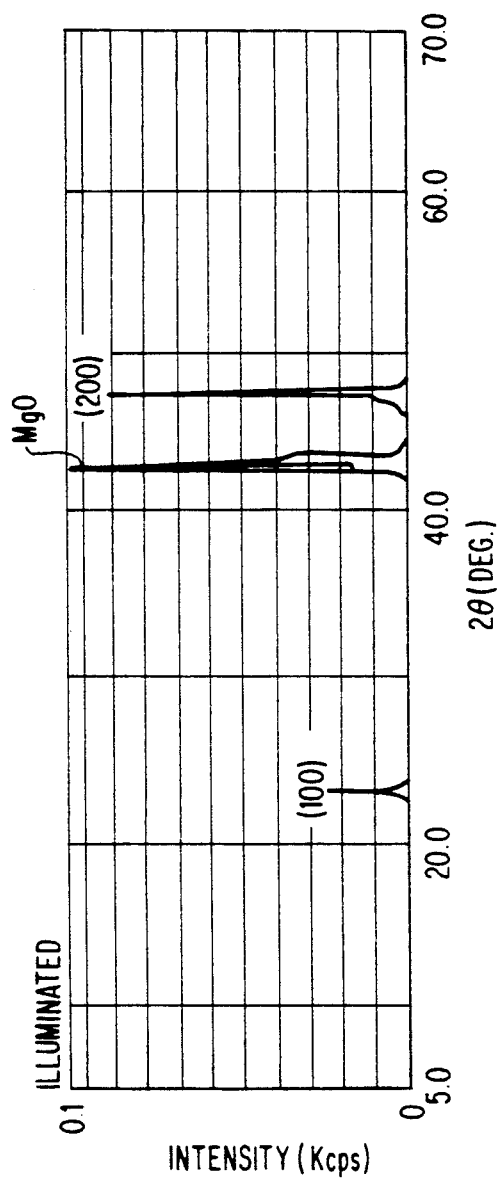
FIG. 2 is a chart showing the results of X-ray diffraction on the oxide superconducting film formed in the UV-irradiated area of a substrate in Example 1, Test 1.
Figure 3:
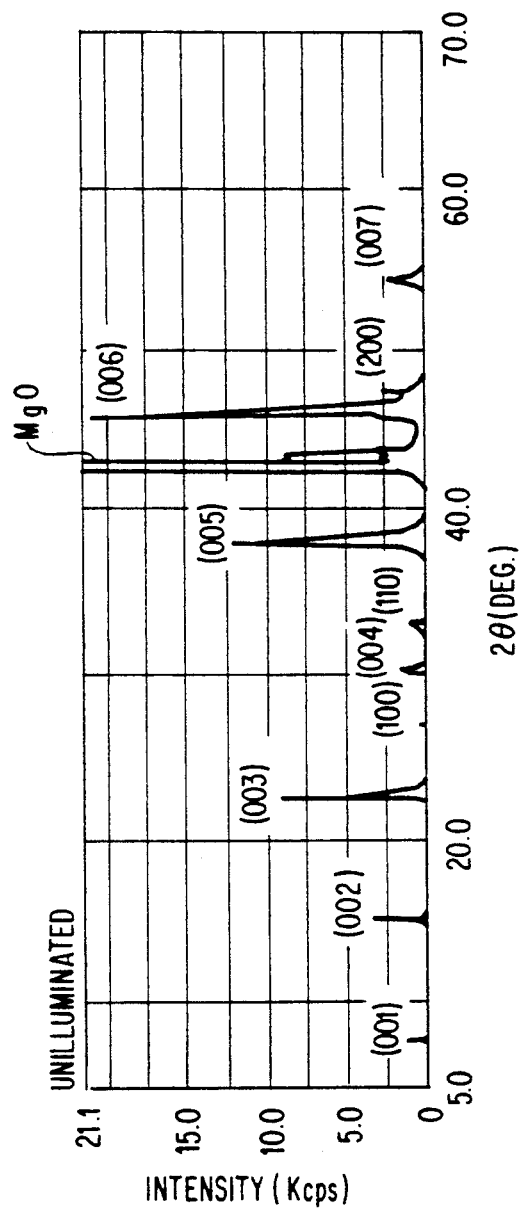
FIG. 3 is a chart showing the results of X-ray diffraction pattern of the oxide superconducting film formed in the non-irradiated area of a substrate in Example 1, Test 1.

The superconducting film (0.5 μm thick) that was formed with the substrate being heated at 700° C. was subjected to X-ray diffraction and the results are shown in FIG. 2 (for the UV-irradiated area) and FIG. 3 (for the non-irradiated area). Very few crystals in the superconducting film of the non-irradiated area of the c-axis were oriented parallel to the substrate ((100) and (200) faces; the orientation of this type is hereunder referred to as "parallel orientation") and almost all the results in the non-irradiated area of the c-axis were oriented normal to the substrate (the orientation of this type is hereunder referred to as "normal orientation"). On the other hand, the c-axes of all crystals in the superconducting film in the UV-irradiated area showed parallel orientation.

Figure 4:
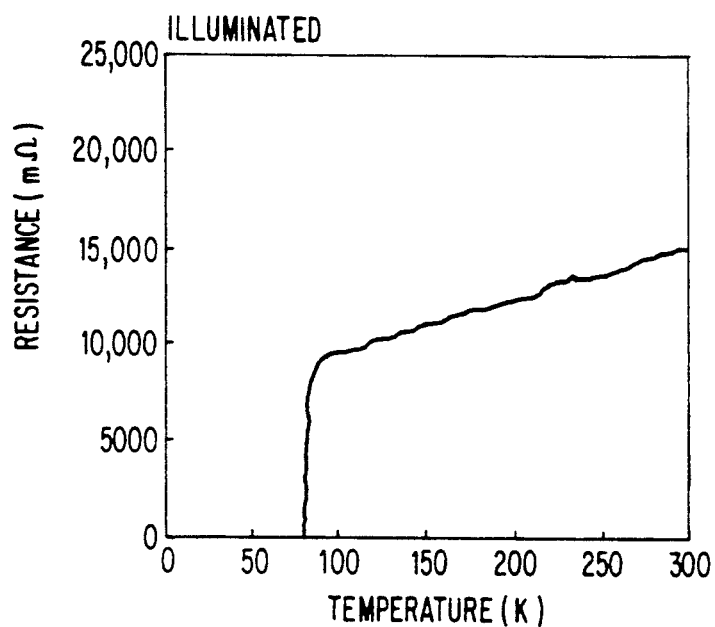
FIG. 4 is a graph showing the critical temperature of the oxide superconducting film formed in the UV-irradiated area of the substrate in Example 1, Test 1.
Figure 5:
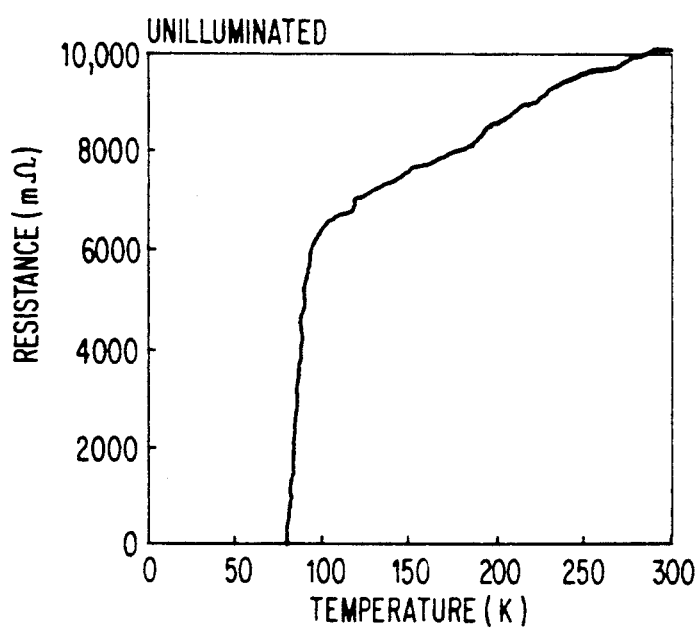
FIG. 5 is a graph showing the critical temperature of the oxide superconducting film formed in the non-irradiated area of the substrate in Example 1, Test 1.

The critical temperature (for zero resistance) $T_{c(zero)}$ was measured for both areas; it was found to be 78 K in the UV-irradiated area as shown in FIG. 4, which was substantially the same as the value indicated in FIG. 5 for the non-irradiated area (79 K).

(ii) Test 2

Figure 6:
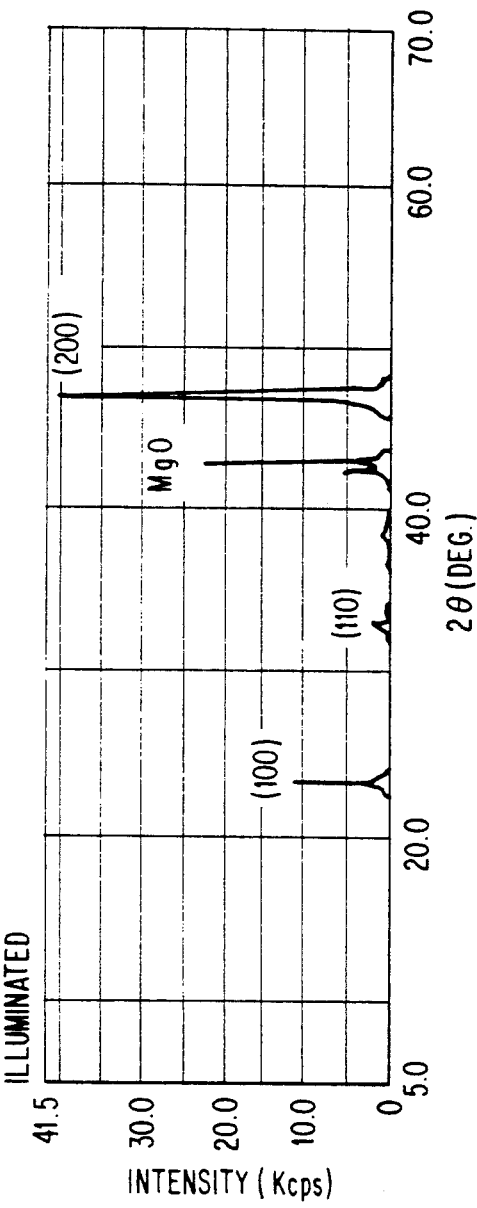
FIG. 6 is a chart showing the results of X-ray diffraction pattern of the oxide superconducting film formed in the UV-irradiated area of the substrate in Example 1, Test 2.
Figure 7:
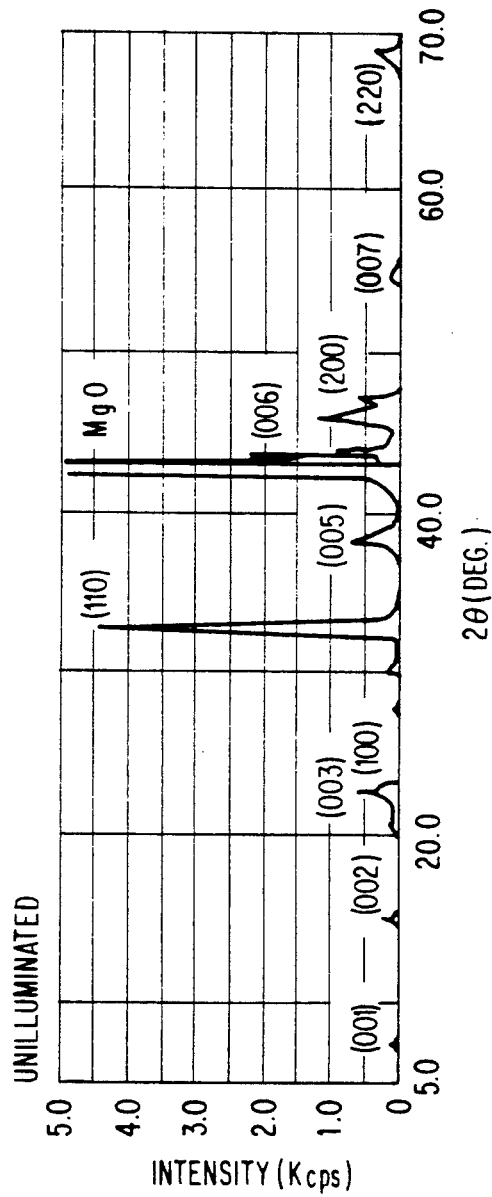
FIG. 7 is a chart showing the results of X-ray diffraction pattern of the oxide superconducting film formed in the non-irradiated area of the substrate in Example 1, Test 2.

The superconducting film (0.5 μm thick) that was formed with the substrate being heated at 650° C. was subjected to X-ray diffraction and the results are shown in FIG. 6 (for the UV-irradiated area) and FIG. 7 (for the non-irradiated area). As in Test 1, the superconducting film in the non-irradiated area showed "normal orientation" for almost all crystals and the film in the UV-irradiated area showed "parallel orientation".

Figure 10:
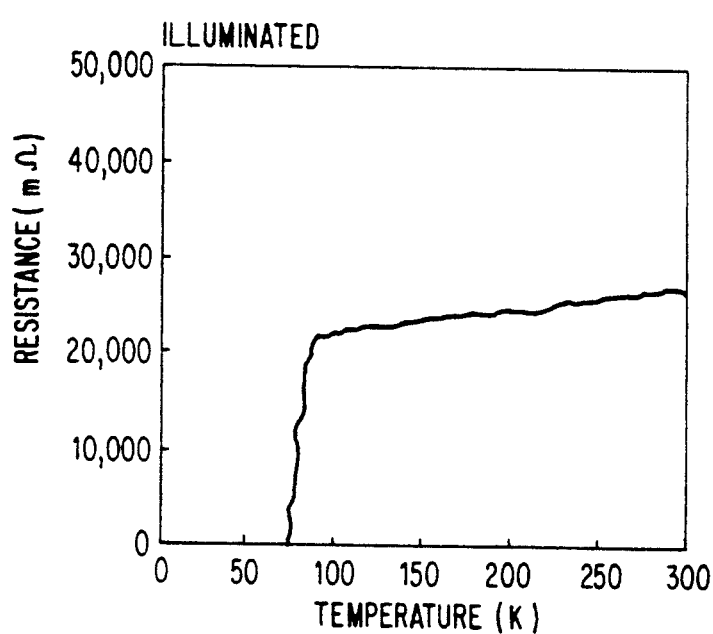
FIG. 10 is a graph showing the critical temperature of the oxide superconducting film formed in the UV-irradiated area of the substrate in Example 1, Test 2.
Figure 11:
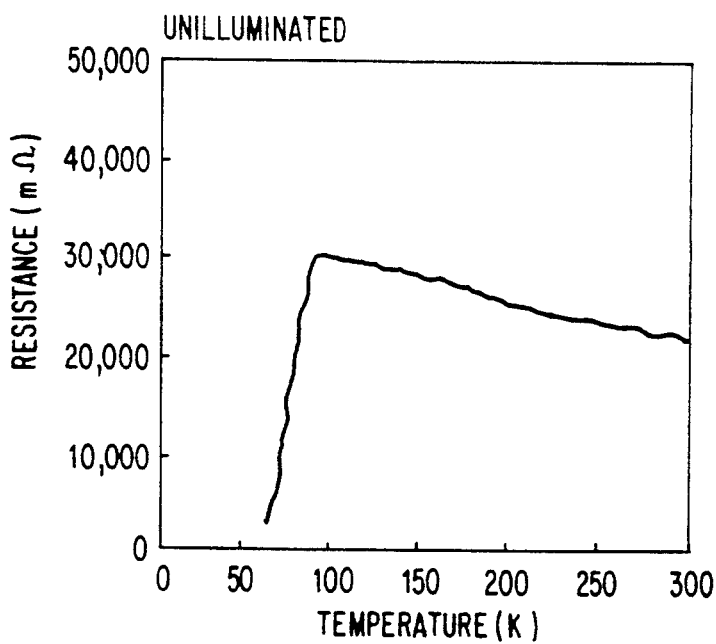
FIG. 11 is a graph showing the critical temperature of the oxide superconducting film formed in the non-irradiated area of the substrate in Example 1, Test 2.

The critical temperature $T_{c(zero)}$ was also measured for both areas; it was found to be 72° K. in the UV-irradiated area as shown in FIG. 10, which was markedly higher than the value indicated in FIG. 11 for the non-irradiated area (45° K.).

An electron micrograph was taken at a magnification of 14,000 to examine the surface of the superconducting film in each area and the results are shown in FIG. 8 (for the UV-irradiated area) and FIG. 9 (for the non-irradiated area). Obviously, the film in the UV-irradiated area was entirely free from the asperities that occurred in the film in the non-irradiated area and, at the magnification of 14,000, the film in the irradiated area had a very smooth surface that looked as if it were formed of single crystals, although it is not completely clear whether this is truly the case.

(iii) Test 3

Figure 12:
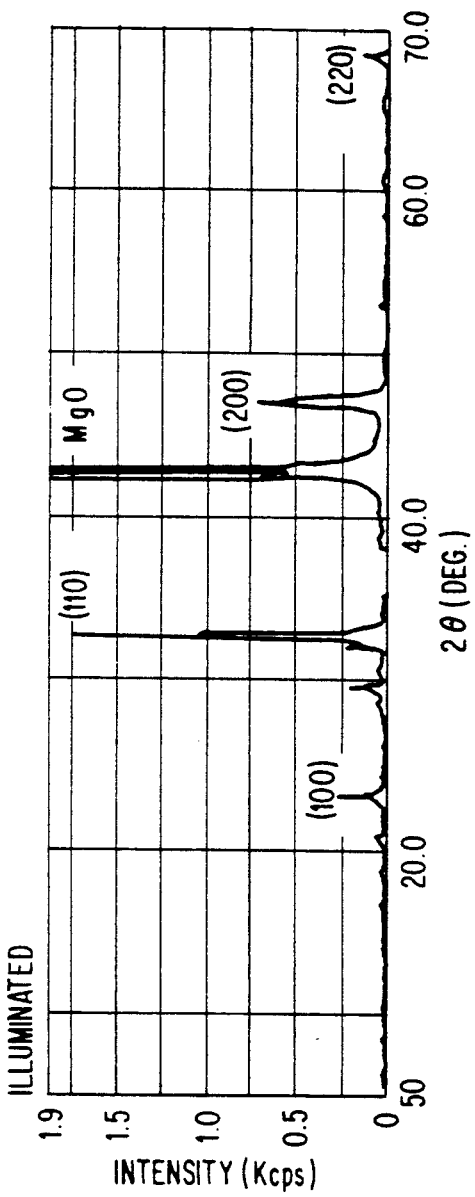
FIG. 12 is a chart showing the results of X-ray diffraction pattern of the oxide superconducting film formed in the UV-irradiated area of a substrate in Example 1, Test 3.
Figure 13:
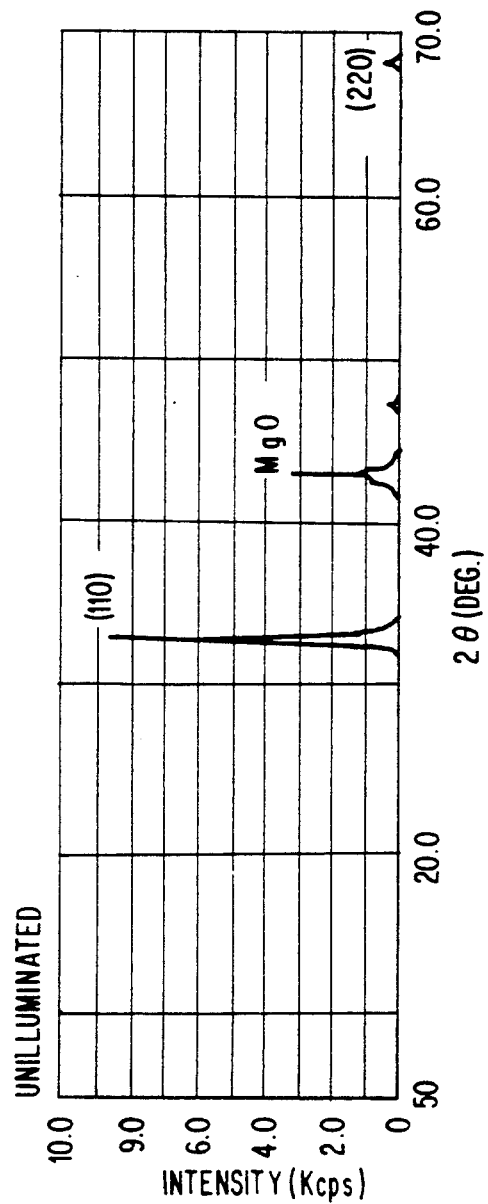
FIG. 13 is a chart showing the results of X-ray diffraction pattern of the oxide superconducting film formed in the non-irradiated area of a substrate in Example 1, Test 3.

The superconducting film (0.5 μm thick) was formed with the substrate being heated at 600° C. was subjected to X-ray diffraction. The results are shown in FIG. 12 (for the UV-irradiated area) and FIG. 13 (for the non-irradiated area). As in Test 1, the super-conducting film in the non-irradiated area showed "normal orientation" for almost all crystals and the film in the irradiated area showed "parallel orientation".

EXAMPLE 2

The process disclosed in Example 1, (2) Formation of oxide superconducting film, was repeated except that a time for irradiating with ArF laser was varried under the following conditions to determine time dependency on ArF laser application.

(a) No laser irradiation was applied throughout one hour deposition.
(b) Laser irradiation was applied in first half deposition time (first 30 minutes).
(c) Laser irradiation was applied in the latter half deposition time (last 30 minutes).

The deposited films thus formed were tested by XRD analysis. The results are shown in FIG. 15 attached.

Figure 15:
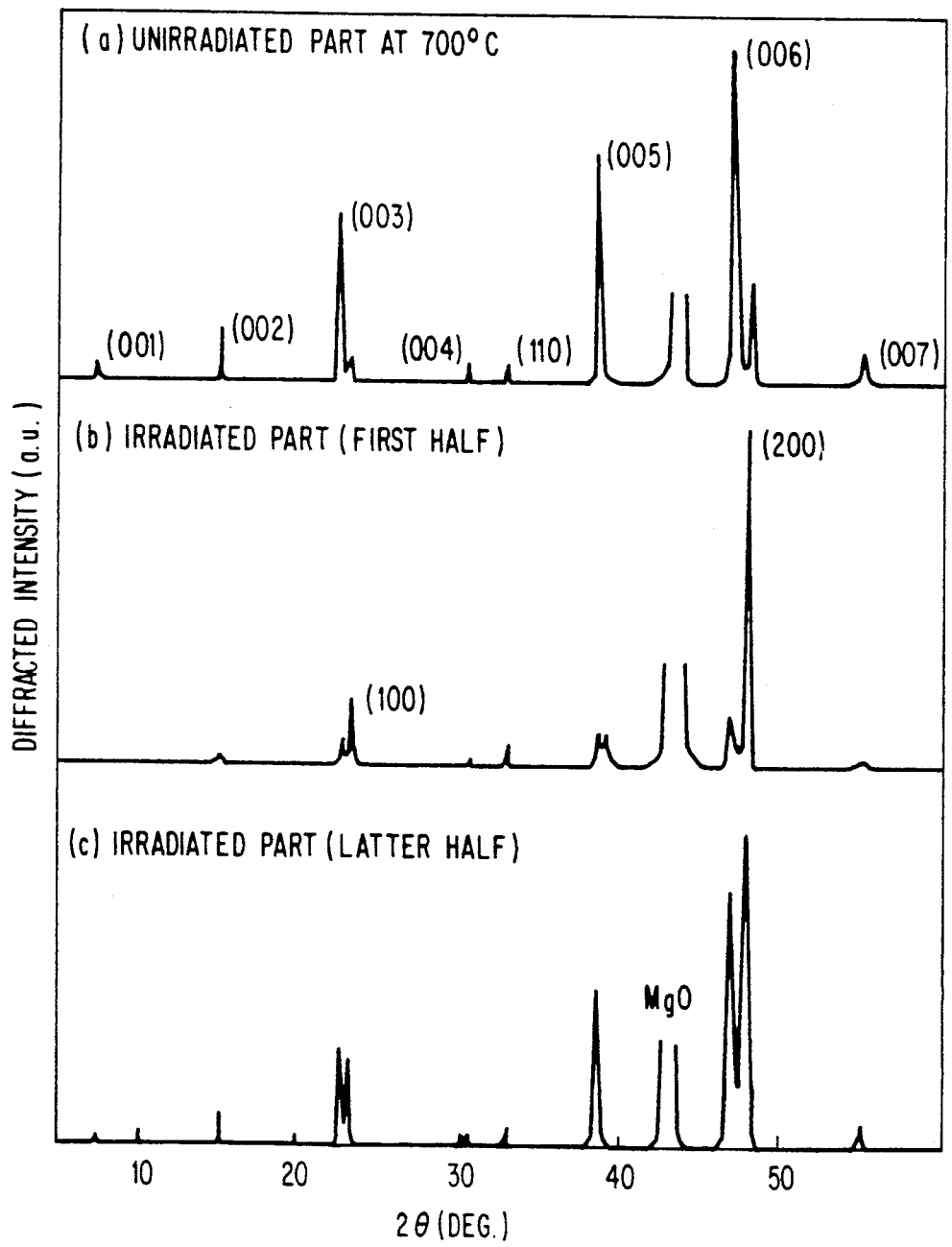
FIG. 15 is a chart showing the results of X-ray diffraction pattern of the oxide superconducting film formed in Example 2.

As clearly seen in FIG. 15, the film formed in condition (a) shows c-axis oriented film, the film under condition (b) shows a-axis oriented film, where as the film under condition (c) shows both a-axis oriented and c-axis oriented film in the same level.

From the results of XRD paterns for film formed under the condition (c), it is understood that a-axis oriented film was deposited over c-axis oriented film, which was primarily deposited without irradiation. It is well known in the arts that as seen in the results of the film under the condition (b), if the film was deposited under laser light irradiation, the deposited film likely shows the same orientation as of the previously deposited.

EXAMPLE 3

The process disclosed in Example 1, (2) Formation of oxide superconducting film, was repeated except that polycrystalline MgO, YSZ(100), or SrTiO$_{3(100)}$ was used in place of MgO(100) as a substrate, and a power output was 70 mJ/cm$^2$ in place of 100 mJ/cm$^2$. The substrates were heated at 700° C. for polycrystalline MgO substrate and YSZ(100) substrate and at 730° C. for SrTiO$_3$(100) substrate. To evaluate the advantages of the present invention the deposited film was tested by XRD patern. The results are shown in FIG. 16.

Figure 16:
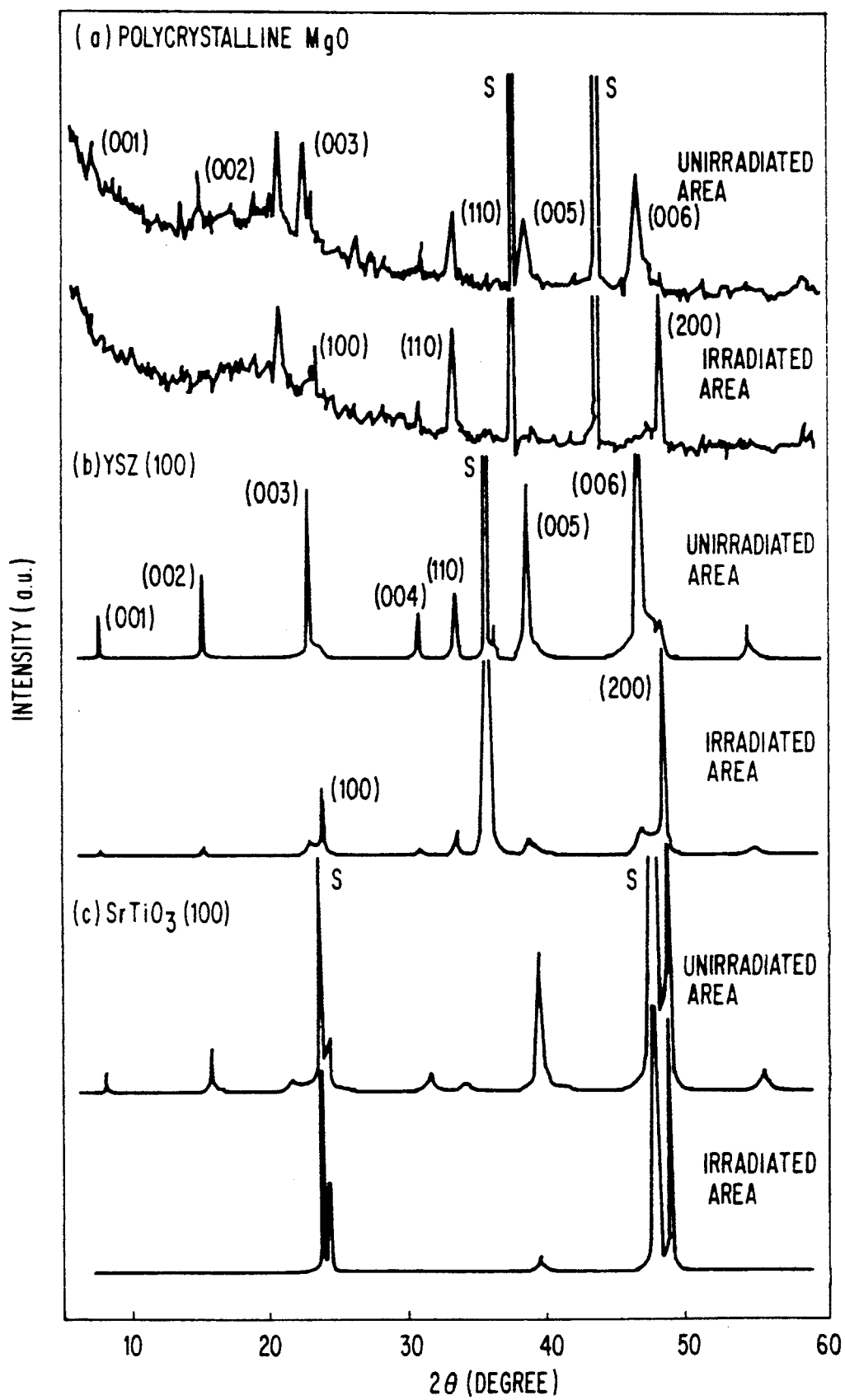
FIG. 16 is a chart showing the results of X-ray diffraction pattern of the oxide superconducting film formed in Example 3 with comparisons formed with no irradiation of lazer light.

As seen in FIG. 16 comparing with the results of films formed with no irradiation, it is confirmed that the advantages of the present invention were also attained even when various kinds of substrate were used.

The present invention is in no way limited to the aforementioned example and, depending upon the object and use of the oxide superconducting film, various modifications can be made without departing form the scope of the invention. To state more specifically, MgO was used as the substrate material in the foregoing example but, as already mentioned, similar result may be attained even if various other substrate materials are used. Further, in the example, the films were formed by vapor-phase growth of an oxide on the (100) face of MgO crystal; however, it is believed that a film with the c-axis oriented parallel to the substrate can also be formed on (110) and other faces of MgO.

The aforementioned conditions of film formation, such as the kinds of organic metal materials, the heating method, the heating temperature, the flow rates of the respective organic metal materials, the flow rate of oxygen, the parameters for generating UV light (e.g. the operating wavelength of a laser, its oscillating frequency and output power), as well as the degree of vacuum and the period of film formation may be controlled in various ways as long as a desired film can be formed by vapor-phase growth.

In the tests described above, the illuminated area was linear; however, as already mentioned hereinabove, the illuminated area can be formed as disperse spots, parallel lines, a grid pattern or any other geometry by scanning laser light over the substrate accordingly. Various patterns of the illuminated area can be formed very easily and in accordance with a specific object. In these cases, the matrix in the unilluminated area (the c-axis is oriented normal to the substrate) has the illuminated area of a different orientation (the c-axis is oriented parallel to the substrate) formed therein. This structure is such that one can benefit from the "pinning" effect. As reported in Proceedings of the 2nd International Symposium on Superconductivity (ISS '89), supra (which concerns a structure of a dissimilar orientation formed as disperse sports), the "pinning effect" should also work effectively in the present invention. If the illuminated area is in the form of parallel lines or in a grid pattern, the effectiveness of the "pinning effect" would be more pronounced than when the film has the known "disperse-spot" structure. Hence, the structures provided in accordance with the present invention can produce a large critical current density $J_c$.

If desired, a given substrate may be overlaid with a film (e.g. a thin film) having the c-axis oriented parallel to the substrate, which film in turn is overlaid with a film having the reverse (normal) orientation and then with film having the parallel orientation, thereby providing a structure in which films of different orientations are superposed alternately. The number of films to be superposed, the thickness of an individual layer, etc. are not limited in any particular way and may be selected as appropriate for a specific object and use. A composite film of this multi-layered structure can be readily formed by the method of the present invention. If the laser light used as exciting light emits in the ultraviolet region, the temperature of the illuminated area will not be increased to such a high level as to melt the oxide film; hence, films can successively be formed on top of another without destroying the crystal structure and other properties of the immediate underlying layer.

While the invention has been described in detail and with reference to specific embodiments thereof, it will be apparent to one skilled in the art that various changes and modifications can be made therein without departing from the spirit and scope thereof.

What is claimed is:

1. A method of forming an oxide superconducting film comprising the steps of (1)(a) mixing the vapors of organic metal source materials to form a source gas in such proportions as to provide a metal composition for forming an oxide superconductor or (b) mixing said organic metal materials in such proportions as to provide a metal composition for forming an oxide superconductor and then vaporizing the source material to form a source gas, and (2) bringing said source gas into contact with a heated substrate so that the oxide superconducting film is formed on said substrate by a chemical vapor deposition process, wherein a laser light is irradiated onto said substrate during the formation of said oxide superconducting film on said substrate to form at least one irradiated area of said substrate, whereby the crystallographic orientation of said oxide superconducting film being formed in the at least one irradiated area of said substrate is such that the c-axis is parallel to the substrate.

2. A method according to claim 1 wherein said oxide superconducting film is made of a Y(Ln)-Ba-Cu-O oxide where Y(Ln) is at least one element selected from Y or Ln (lanthanoids).

3. A method according to claim 1 wherein said oxide superconducting film is made of a Bi-Sr-Ca-Cu-O oxide, a Tl-Ba-Ca-Cu-O oxide or a Tl-Sr-Ca-Cu-O oxide.

4. A method according to any one of claims 1, 2 or 3 wherein said laser light emits at one or more wavelengths in the range of 150–400 nm.

5. A method according to claim 4 wherein said laser light is applied onto said substrate to form disperse spots, parallel lines or a grid pattern.

6. A method according to claim 1 wherein at least the surface of said substrate is formed of a ceramic material selected from the group consisting of MgO, $SrTiO_3$, $LaAlO_3$, $Al_2O_3$, $LaGaO_3$, Si, $SiO_2$, $NdGaO_3$ and yttria-stabilized zirconia.

7. A method according to claim 1 wherein said oxide superconducting film is formed on the faces of MgO crystal, the faces of $SrTiO_3$ crystal except a (100) face, the faces of $LaAlO_3$ crystal except a (100) face or the faces of yttria-stabilized zirconia (YSZ) crystal, said faces being formed on at least the surface of the substrate.

8. A method according to claim 2 wherein at least the surface of said substrate is formed of a ceramic material selected from the group consisting of MgO, $SrTiO_3$, $LaAlO_3$, $Al_2O_3$, $LaGaO_3$, Si, $SiO_2$, $NdGaO_3$ and yttria-stabilized zirconia.

9. A method according to claim 3 wherein at least the surface of said substrate is formed of a ceramic material selected from the group consisting of MgO, $SrTiO_3$, $LaAlO_3$, $Al_2O_3$, $LaGaO_3$, Si, $SiO_2$, $NdGaO_3$ and yttria-stabilized zirconia.

10. A method according to claim 4 wherein at least the surface of said substrate is formed of a ceramic material selected from the group consisting of MgO, $SrTiO_3$, $LaAlO_3$, $Al_2O_3$, $LaGaO_3$, Si, $SiO_2$, $NdGaO_3$ and yttria-stabilized zirconia.

11. A method according to claim 5 wherein at least the surface of said substrate is formed of a ceramic material selected from the group consisting of MgO, $SrTiO_3$, $LaAlO_3$, $Al_2O_3$, $LaGaO_3$, Si, $SiO_2$, $NdGaO_3$ and yttria-stabilized zirconia.

* * * * *